(12) United States Patent
Wang et al.

(10) Patent No.: US 12,323,108 B2
(45) Date of Patent: Jun. 3, 2025

(54) LOW NOISE AMPLIFIER TOPOLOGY

(71) Applicant: Analog Devices, Inc., Wilmington, MA (US)

(72) Inventors: Xudong Wang, Colorado Springs, CO (US); William B. Beckwith, Palmer Lake, CO (US)

(73) Assignee: ANALOG DEVICES, INC., Wilmington, MA (US)

( * ) Notice: Subject to any disclaimer, the term of this patent is extended or adjusted under 35 U.S.C. 154(b) by 316 days.

(21) Appl. No.: 17/689,422

(22) Filed: Mar. 8, 2022

(65) Prior Publication Data

US 2022/0385242 A1  Dec. 1, 2022

Related U.S. Application Data

(60) Provisional application No. 63/195,091, filed on May 31, 2021.

(51) Int. Cl.
*H03F 1/32* (2006.01)
*H03F 3/19* (2006.01)
*H04B 1/04* (2006.01)

(52) U.S. Cl.
CPC .............. *H03F 1/32* (2013.01); *H03F 3/19* (2013.01); *H04B 1/04* (2013.01);
(Continued)

(58) Field of Classification Search
CPC .......... H04B 1/0475; H04B 2001/0433; H04B 1/40; H04B 1/16; H04B 1/18; H04B 1/1607; H04B 1/48; H04B 1/44; H04B 1/525; H04B 1/006; H04B 2001/0408; H04B 1/0458; H04B 1/3827; H04B 1/005; H04B 1/10; H04B 1/1027; H04B 1/26; H04B 1/7097; H04B 2001/1072; H03F 2200/294; H03F 2200/451; H03F 1/223; H03F 1/565; H03F 3/195; H03F 3/193; H03F 3/72; H03F 2200/222; H03F 2200/387; H03F 2200/489; H03F 3/245; H03F 1/3205; H03F 1/347; H03F 2200/111; H03F 2200/492; H03F 3/211; H03F 2200/391; H03F 2200/75; H03G 1/0088;
(Continued)

(56) References Cited

U.S. PATENT DOCUMENTS 7,649,722 B2   1/2010 Thijs et al.
9,203,596 B2*  12/2015 Granger-Jones .......... H04L 5/08
(Continued)

*Primary Examiner* — Golam Sorowar
(74) *Attorney, Agent, or Firm* — ARENTFOX SCHIFF LLP

(57) ABSTRACT

A low noise amplifier topology can achieve very low noise figure by applying multiple magnetic coupling between gate matching inductors and source degeneration inductor of a field effect transistor. The resulting low noise amplifier has smaller inductors, which can have lower thermal noise contribution, and can maintain good gain and linearity performance. For example, a low noise amplifier includes a first inductor to receive an input; a second inductor coupled to the first inductor in series; a first field effect transistor device whose gate receives a signal from the second inductor; and a third inductor coupled to a source of the first field effect transistor device, where the third inductor is magnetically positively coupled to the first inductor and the second inductor.

15 Claims, 13 Drawing Sheets

(52) U.S. Cl.
CPC .. *H03F 2200/294* (2013.01); *H03F 2200/451* (2013.01); *H04B 2001/045* (2013.01)

(58) Field of Classification Search
CPC ............... H03G 1/0029; H03G 1/0023; H03G 2201/504; H03G 3/001; H03G 3/3036; H03G 3/3052; H03G 3/3042; H03G 2201/307
See application file for complete search history.

(56) References Cited

U.S. PATENT DOCUMENTS

| | | | |
|---|---|---|---|
| 9,479,160 B2 * | 10/2016 | Srihari | H03K 17/687 |
| 9,825,597 B2 * | 11/2017 | Wallis | H03F 1/34 |
| 9,847,765 B1 * | 12/2017 | Helm | H03F 3/193 |
| 11,128,266 B1 * | 9/2021 | Fraser | H04W 52/52 |
| 11,888,453 B2 * | 1/2024 | Medra | H03F 1/347 |
| 2011/0279184 A1 * | 11/2011 | Chan | H03F 1/347 |
| | | | 330/277 |
| 2017/0194918 A1 * | 7/2017 | Wallis | H03F 1/223 |
| 2018/0083762 A1 * | 3/2018 | Kogure | H03F 3/245 |
| 2021/0159860 A1 * | 5/2021 | Pehlivanoglu | H03F 3/181 |
| 2022/0021347 A1 * | 1/2022 | Kovac | H03F 3/195 |

* cited by examiner

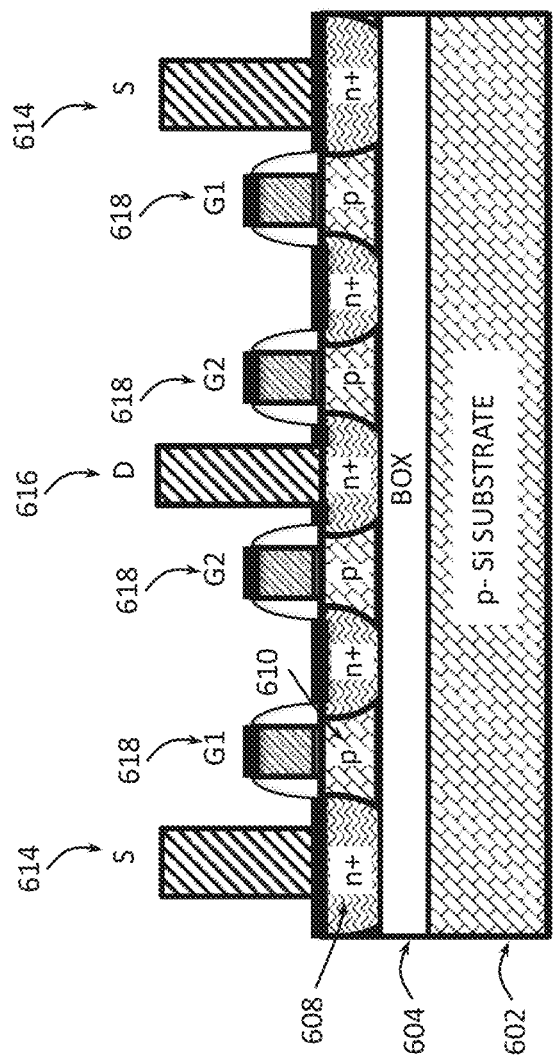
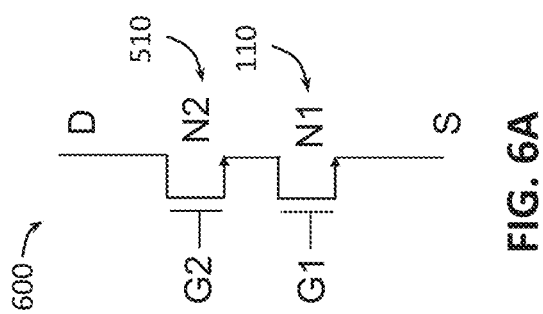
FIG. 6A
FIG. 6B

LOW NOISE AMPLIFIER TOPOLOGY

CROSS REFERENCE TO RELATED APPLICATIONS

The present application claims priority to and the benefit of the U.S. Provisional Patent Application No. 63/195,091 entitled "LOW NOISE AMPLIFIER TOPOLOGY" and filed May 31, 2021, which is hereby incorporated by reference in its entirety as if fully set forth below and for all applicable purposes.

TECHNICAL FIELD OF THE DISCLOSURE

The present disclosure relates generally to low noise amplifiers, more particularly but not limited to, low noise amplifier topologies with multiple magnetic coupled inductors.

BACKGROUND

Radio systems are systems that transmit and receive signals in the form of electromagnetic waves in the RF range of approximately 3 kilohertz (kHz) to 300 gigahertz (GHz). Radio systems are commonly used for wireless communications, with cellular/wireless mobile technology being a prominent example but may also be used for cable communications such as cable television. In both of these types of communication systems, low noise amplifier is a critical circuit block. More specifically, a communication receiver system may include a low noise amplifier in its frontend to amplify a received signal (which may have a low signal power) while minimizing the amount of added noise and/or distortion. The low noise amplifier's noise, gain, and linearity performance may directly impact the receiver system's overall performance.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 6A and 6B illustrate a multi-gate field effect transistor, according to some embodiments of the disclosure;

DESCRIPTION OF EXAMPLE EMBODIMENTS OF THE DISCLOSURE

Overview

Figure 1:
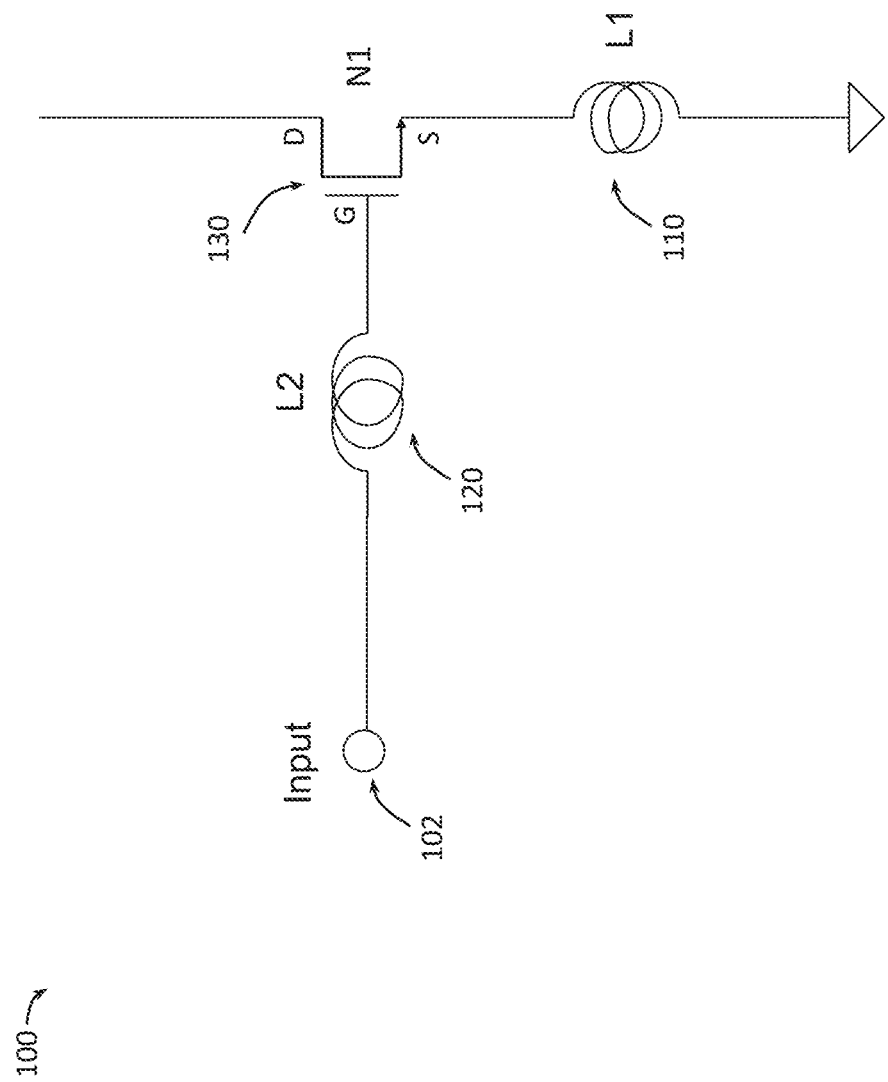
FIG. 1 illustrates a source degenerated low noise amplifier.

A low noise amplifier topology can achieve very low noise figure by applying multiple magnetic coupling between gate matching inductors and source degeneration inductor of a field effect transistor. The resulting low noise amplifier has smaller inductors, which can have lower thermal noise contribution, and can maintain good gain and linearity performance.

According to aspects of the present disclosure, a low noise amplifier may include a first inductor to receive an input (e.g., an input signal), a second inductor coupled to the first inductor in series, a first field effect transistor device whose gate receives a signal from the second inductor, and a third inductor coupled to a source of the first field effect transistor device. The first, second, and third inductors may be magnetically and positively coupled with one another. To that end, the traces of the first inductor, the second inductor, and the third inductor may be placed in close proximity with each other so that a magnetic field caused by a current in one inductor may induce a voltage in another inductor. The positive coupling may refer to the induced voltage being in phase with the voltage across the inductor in which the current is generated. In some aspects, a coupling factor (e.g., K3) between the first inductor and the second inductor is smaller than a coupling factor (e.g., K2) between the first inductor and the third inductor. In some aspects, a coupling factor (e.g., K3) between the first inductor and the second inductor is smaller than a coupling factor (e.g., K1) between the second inductor and the third inductor. In some aspects, each of the first, second, and third inductors is coupled to one another by a coupling factor greater than 0.1.

To broaden the input matching bandwidth, the low noise amplifier can further include a first capacitor coupled between (1) a node between the first inductor and the second inductor, and (2) a ground potential. In some aspects, the low noise amplifier can optionally include a second capacitor coupled between (1) an input to the low noise amplifier, and (2) a ground potential.

To improve the stability of the low noise amplifier and/or reduce miller effect, the low noise amplifier can further include a second field effect transistor device arranged in a cascode configuration with the first field effect transistor device. In some aspects, the low noise amplifier can further include a capacitor coupled to a gate of the second field effect transistor device. In some aspects, the first field effect transistor device and the second field effect transistor device may be implemented together as a dual gate field effect transistor device.

To protect the low noise amplifier from electrostatic discharge (ESD) damage, the low noise amplifier can further include a fourth inductor coupled between (1) an input to the low noise amplifier, and (2) a ground potential. In some aspects, the fourth inductor can have a larger inductance than the first inductor, the second inductor, and the third inductor. In some aspects, the low noise amplifier can further include a capacitor coupled between (1) the input to the low noise amplifier, and (2) a ground potential, and in parallel with the fourth inductor. In some aspects, the low noise amplifier can further include a third field effect transistor device whose drain is coupled to the input to the low noise amplifier and source is coupled to a ground potential, the third field effect transistor device further connected in parallel with the fourth inductor. In some aspects, a gate of the third field effect transistor device may receive a control signal from a power detector.

The low noise amplifier discussed herein may be suitable for use in wireless communication systems and/or sensor systems. In particular, the systems, schemes, and mechanisms described herein can advantageously improve signal-to-noise ratio (SNR) and linearity performance for very low-power input signals.

Source Degenerated Low Noise Amplifiers

FIG. 1 illustrates a source degenerated low noise amplifier (LNA) 100. Specifically, the low noise amplifier 100 is a complementary metal-oxide semiconductor (CMOS) LNA with a common-source architecture. For simplicity, only the certain circuit elements are shown, and the LNA 100 may include other components not illustrated in the FIGURE. As shown in FIG. 1, the LNA 100 includes a transistor 130 N1, an inductor 110 L1 at the source (shown by the symbol S) of the inductor 130 N1, and an inductor 120 L2 at the gate (shown by the symbol G) of the transistor 130 N1. In some aspects, the transistor 130 N1 may be a field effect transistor (FET). In operation, the inductor 120 L2 may receive an input signal at the input node 102 and provides the input signal to the gate of the transistor 130 N1.

The inductor 110 L1 can provide source degeneration. The inductor 110 L1 can also provide an equivalent higher resistance at the gate of the transistor 130 N1 to help with input matching at the gate of the transistor 130 N1. The inductor 110 L1 can reduce gain at the source of the transistor 130 N1. The inductor 110 L1 can provide noise matching. With inductive source degeneration, the LNA 100 may provide a low noise figure, high gain, and low power consumption.

The inductor 120 L2 at the gate of the transistor 130 N1 is used for input impedance matching. For instance, the inductor 120 L2 can remove the gate-to-source impedance of the transistor 130 N1 at the resonant frequency and hence making the impedance at the input to be a real value, for example, including an input resistance $R_{in}$.

Figure 2:
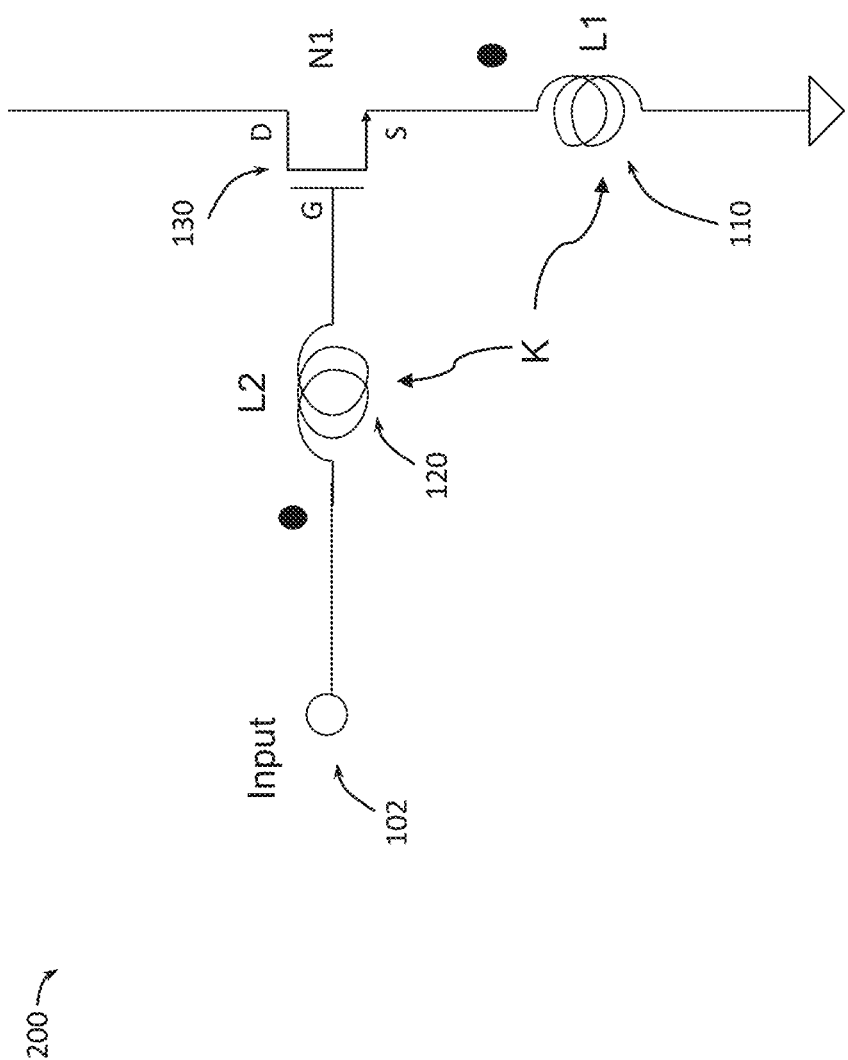
FIG. 2 illustrates a source degenerated low noise amplifier with magnetically positively coupled inductors.

FIG. 2 illustrates a source degenerated LNA 200. The LNA 200 may be substantially similar to the LNA 100 of FIG. 1, but the inductor 110 L1 and the inductor 120 L2 are magnetically positively coupled, for example, by a coupling factor K. The dot notation in FIG. 2 indicates the phase of magnetic coupling between the inductor 110 L1 and the inductor 120 L2. The positive coupling between the inductor 110 L1 and the inductor 120 L2 can serve two functions. First, the coupling can add flexibility for simultaneous tuning of input impedance matching and noise matching. Second, the size of the inductor 110 L1 and the inductor 120 L2 can be reduced.

The inductances of the inductor 110 L1 and the inductor 120 L2 can be reduced because of the mutual inductance between the inductor 110 L1 and the inductor 120 L2. For instance, if the inductor 110 L1 and the inductor 120 L2 have the same quality (Q) factor as when K=0 (i.e., no coupling), the series resistance of the inductor 110 L1 and the inductor 120 L2 can be reduced because of the reduced inductance. As a result, a lower noise figure can be realized by the LNA 200 as seen in FIG. 2 compared to the LNA 100 of FIG. 1.

Unfortunately, the lower noise figure achieved by the LNA 200 in FIG. 2, with inductor degeneration to match the impedance and noise at the same time, may not be low enough for some applications. In advanced CMOS or CMOS silicon on insulator (SOI) process, the minimum noise figure of an active device (i.e., FET) is generally very low. However, when it is used in practical circuit design, its noise figure is degraded by interconnections between the intrinsic device and impedance matching circuits. Also, the different requirement for impedance matching and noise matching results in further degradation for the LNA's performance. Therefore, there is a need for an LNA circuit topology that can achieve a low noise figure so that an LNA can be integrated with the other CMOS or CMOS SOI circuit blocks on chip. Otherwise, an external LNA off-chip with the CMOS or CMOS SOI circuit blocks is be used to achieve a low noise figure, which results in higher cost and large system solution.

Improved LNA Circuit Topology

The improved LNA circuit topology described herein enables simultaneous impedance matching and noise matching for a FET LNA amplifier and can achieve lower noise figure performance than existing LNA topology. The improved LNA circuit topology achieves a low enough noise figure to be integrated with other CMOS or CMOS SOI circuit blocks, which reduces cost, and makes the overall system solution more highly integrated and smaller. Pushing the limits of achieving low noise figure for an LNA is particularly challenging. However, ability to improve the noise figure even in the order of 0.1 decibel (dB) can significantly impact the sensitivity and performance of the overall receiver system.

Figure 3:
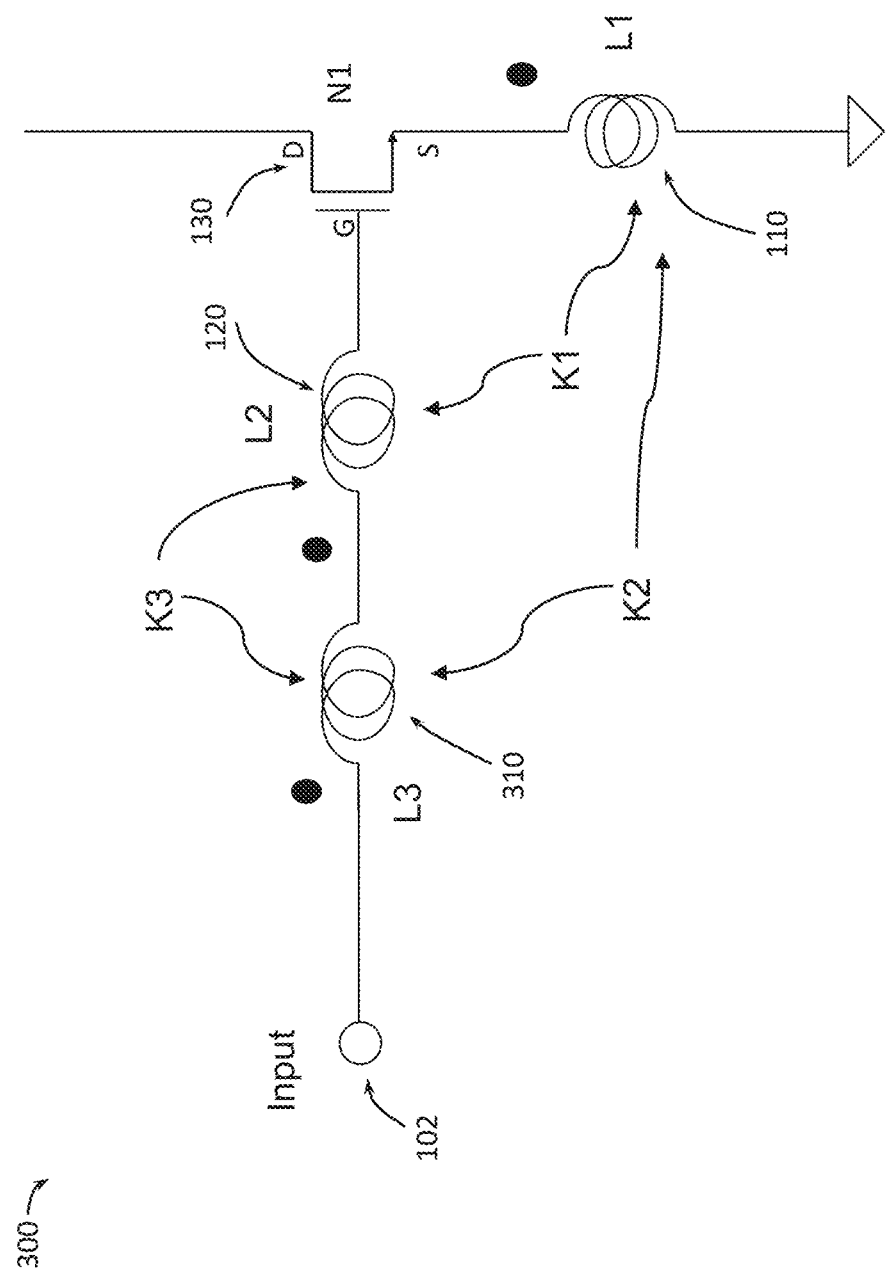
FIG. 3 illustrates an improved source degenerated low noise amplifier, according to some embodiments of the disclosure.

FIG. 3 illustrates an improved source degenerated LNA 300, according to some embodiments of the disclosure. The LNA 300 of FIG. 3 shares many elements with the LNA 200 of FIG. 2; for brevity, a discussion of these elements is not repeated, and these elements may take the form of any of the embodiments disclosed herein.

As shown in FIG. 3, the LNA 300 includes an additional inductor 310 L3 in series with the inductor 120 L2 compared to the LNA 200 of FIG. 2. In operation, the inductor 310 L3 may receive an input signal at the input node 102, and passes the input signal to the inductor 120 L2, which in turns passes the input signal to the gate of the transistor 130 N1. The addition of the inductor 310 L3 yields many advantages, including but not limited to, providing more degrees of freedom to optimize magnetic coupling between the three inductors 110, 120, and 130, and layout can be made easier.

In the LNA 300, the inductor 120 L2 and the inductor 310 L3 are designed to magnetically positively couple to the inductor 110 L1. For instance, the inductor L1 110 and the inductor L2 120 are magnetically positively coupled by a factor K1, the inductor L1 110 and the inductor L3 310 are magnetically positively coupled by a factor K2, and the inductor L2 120 and the inductor L3 310 are magnetically positively coupled by a factor K3. To enable the magnetic coupling, metal traces of the inductor 110 L1, the inductor L2 120, and the inductor 310 L3 may be placed in close proximity to each other. In some aspects, the inductor 110 L1 metal trace can be placed vertically above or below the inductor 120 L2 and the inductor 310 L3 in a different metal layer as will be discussed more fully below with reference to FIG. 12. In other aspects, the inductor 110 L1 metal trace can be placed between the inductor 120 L2 and the inductor 310 L3 on the same metal layer as will be discussed more fully below with reference FIG. 13.

In some aspects, the coupling factor K1 (between the inductor 110 L1 and the inductor 120 L2 coupling factor), the coupling factor K2 (between the inductor 110 L1 and the inductor 310 L3 coupling factor) can be adjusted independently. In some aspects, the coupling factor K3 (between the inductor 120 L2 and the inductor 310 L3 coupling factor) can be smaller than K1 and K2. In general, each of the coupling factors K1, K2, and K3 may be greater than 0.1 to provide magnetic coupling.

Compared with the LNA 200 in FIG. 2, the LNA 300 of FIG. 3 can achieve better optimum noise matching and impedance matching. Additionally, the LNA 300 may provide a wider matching bandwidth than the LNA 200. Further, the mutual coupling topology shown in FIG. 3 can allow the sizes of the inductor 110 L1, the inductor 120 L2, and/or the inductor 310 L3 inductor to be reduced compared to the LNA 200. The smaller inductor sizes may also mean a smaller parasitic resistance for the same Q of inductance. Generally, the resistance at the gate and source nodes (of the transistor 130 N1) may be the main thermal noise contributor to the noise figure of an LNA. As a result, the LNA 300 topology shown in FIG. 3 can result in a lower noise figure for the same Q of inductance.

In some aspects, the independent coupling factors K1, K2, and K3 along with the splitting of the input matching inductor into the inductor 120 L2 and the inductor 310 L3 can add flexibility for input impedance matching and noise matching. Further, the independent coupling factors K1, K2, K3 and the splitting of the input matching inductor can make it easier for the circuit to meet simultaneous impedance matching and noise matching requirement.

Adding Capacitor to Expand Bandwidth

Figure 4:
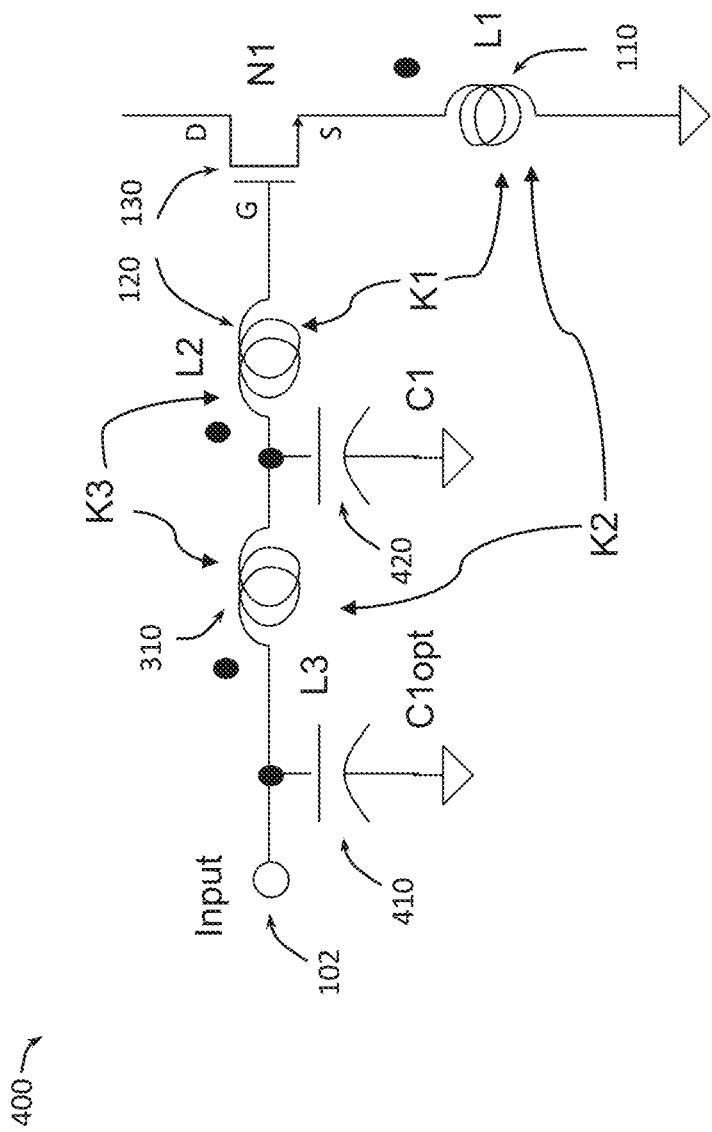
FIG. 4 illustrates an improved source degenerated low noise amplifier, according to some embodiments of the disclosure.

FIG. 4 illustrates an improved source degenerated LNA 400, according to some embodiments of the disclosure. The LNA 400 of FIG. 4 shares many elements with the LNA 300 of FIG. 3; for brevity, a discussion of these elements is not repeated, and these elements may take the form of any of the embodiments disclosed herein.

As shown in FIG. 4, the LNA 400 includes an additional capacitor C1 420 compared to the LNA 300 of FIG. 3. The capacitor C1 420 is coupled between a node between the inductor 310 L3 and the inductor 120 L2, and a ground potential (shown by the inverted triangle symbol). Adding the capacitor C1 420 can expand the input matching bandwidth. As shown, the capacitor C1 420, the inductor 310 L3, and the inductor 120 L2 form a T-coil structure.

In some further aspects, the LNA 400 can optionally include a capacitor 410 C1opt at the input node 102. As shown, the capacitor 410 C1opt can be coupled between the input node 102 and a ground potential.

Adding a Cascode Device to Improve Linearity

Figure 5:
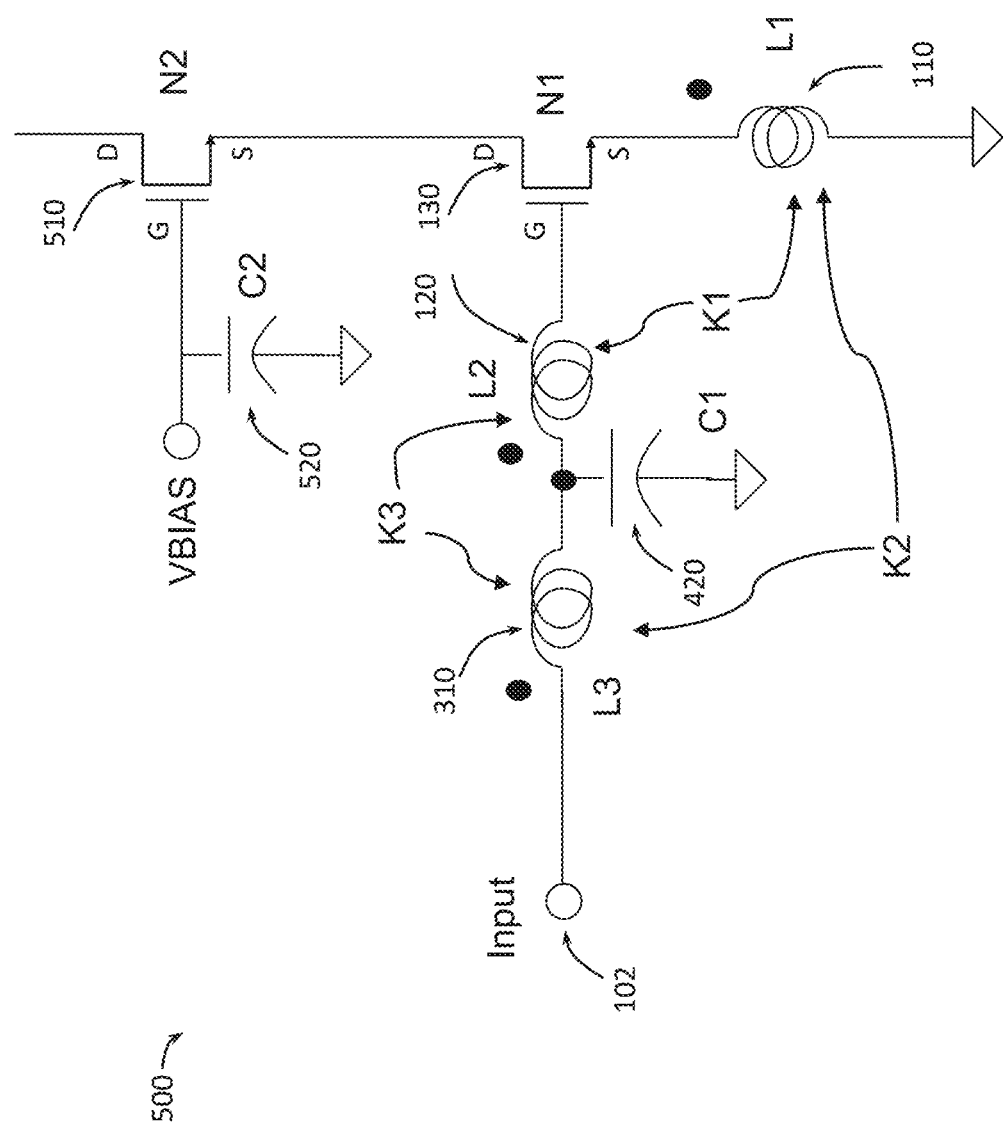
FIG. 5 illustrates an improved source degenerated low noise amplifier, according to some embodiments of the disclosure.

FIG. 5 illustrates an improved source degenerated LNA 500, according to some embodiments of the disclosure. The LNA 500 of FIG. 5 shares many elements with the LNA 400 of FIG. 4; for brevity, a discussion of these elements is not repeated, and these elements may take the form of any of the embodiments disclosed herein.

As shown in FIG. 5, the LNA 500 further includes a transistor 510 N2 and a capacitor 520 C2 compared to the LNA 400 of FIG. 4. The transistor 510 N2 has a gate which receives a bias voltage VBIAS to keep the transistor 510 N2 turned on during operation. The transistor 510 N2 has a source (shown by the symbol S) coupled to the drain (shown by the symbol D) of the transistor 130 N1, in a cascode configuration. The transistor 510 N2 has a common-gate configuration. Due to the cascode structure, the transistor 510 N2 can increase the stability of LNA 500, e.g., by making the transistor 130 N1 more linear and reducing Miller effect.

The capacitor 520 C2 is coupled between the gate (shown by the symbol G) of the transistor 510 N2 and a ground potential. The capacitor 520 C2 may serve as a bypass capacitance which will shunt alternating current (AC), at the gate of transistor 510 N2, to ground. This will allow 510 N2 to function as a common gate amplifier in the cascode structure. Alternatively, the capacitance value of the capacitor 520 C2 may be made smaller, such that it is comparable to the parasitic gate-source capacitance, Cgs, of the transistor 510 N2. This forms a capacitive voltage divider using the capacitor 520 C2 and Cgs and this topology is known as a stacked FET amplifier.

Further Reducing Parasitic Capacitance and Resistance

FIGS. 6A and 6B illustrate a multi-gate FET 600, according to some embodiments of the disclosure. LNAs may achieve a lower noise figure when the parasitic capacitance and resistance can be reduced. The transistor 130 N1 and the transistor 510 N2 from FIG. 5 can be combined and implemented as a multi-gate FET, or a dual gate field effect transistor device structure as illustrated in FIGS. 6A-B. Such implementation can eliminate the source-drain connection between the transistor 130 N1 and the transistor 510 N2. The resulting N1 and N2 dual gate device 610 may have less parasitic capacitance and resistance, which may result in a higher transit frequency ($f_T$) and a lower noise figure for the LNA.

FIG. 6A illustrates combination of the transistor 130 N1 and the transistor 510 N2 as a dual gate device having gates G1 and G2. The source-drain connection between the transistor 130 N1 and the transistor 510 N2 is eliminated.

FIG. 6B illustrates a cross-sectional view of an exemplary multi-gate FET 600. The multi-gate FET 600 may include a substrate layer 602 (e.g., made of p-type silicon (p-Si) material), a buried oxide (BOX) layer 604 disposed on top of the substrate layer 602, a plurality of alternating n+ type material 608 and p type material 610 disposed on top of the BOX layer 604, and source electrodes 614 (shown by the symbol S), drain electrodes 616 (shown by the symbol D), and gate electrodes 618 (shown by the symbol G1 and G2) arranged as shown.

While FIG. 6B illustrates a two finger multi-gate FET in CMOS SOI process, other types of device structures with lower parasitic capacitance and/or resistance can be used to implement the transistor 130 N1 and the transistor 510 N2.

Adding Shunt Devices to Protect the LNA from Electrostatic Discharge Damage

Figure 7:
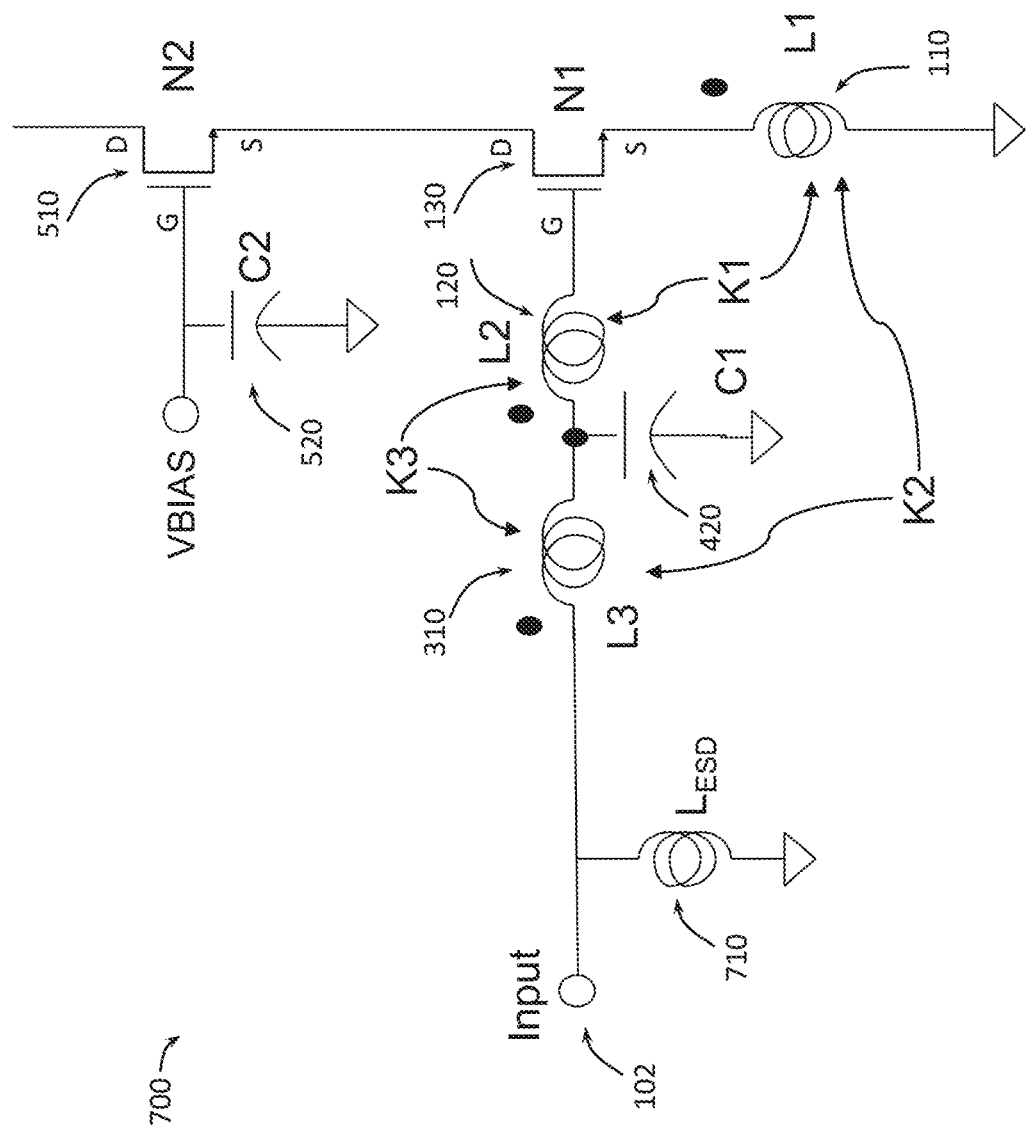
FIG. 7 illustrates an improved source degenerated low noise amplifier, according to some embodiments of the disclosure.

FIG. 7 illustrates an improved source degenerated LNA 700, according to some embodiments of the disclosure. The LNA 700 of FIG. 7 shares many elements with the LNA 500 of FIG. 5; for brevity, a discussion of these elements is not repeated, and these elements may take the form of any of the embodiments disclosed herein.

As shown in FIG. 7, the LNA 700 further includes a shunt inductor 710 $L_{ESD}$ compared to the LNA 500 of FIG. 5. The shunt inductor 710 $L_{ESD}$ is coupled between the input node 102 and a ground potential. The shunt inductor 710 $L_{ESD}$ can protect the LNA 700 from electrostatic discharge (ESD) damage. In some aspects, the shunt inductor 710 $L_{ESD}$ is designed to be large so that its impedance is high and does not impact the input matching and/or the LNA 700 noise figure.

Figure 8:
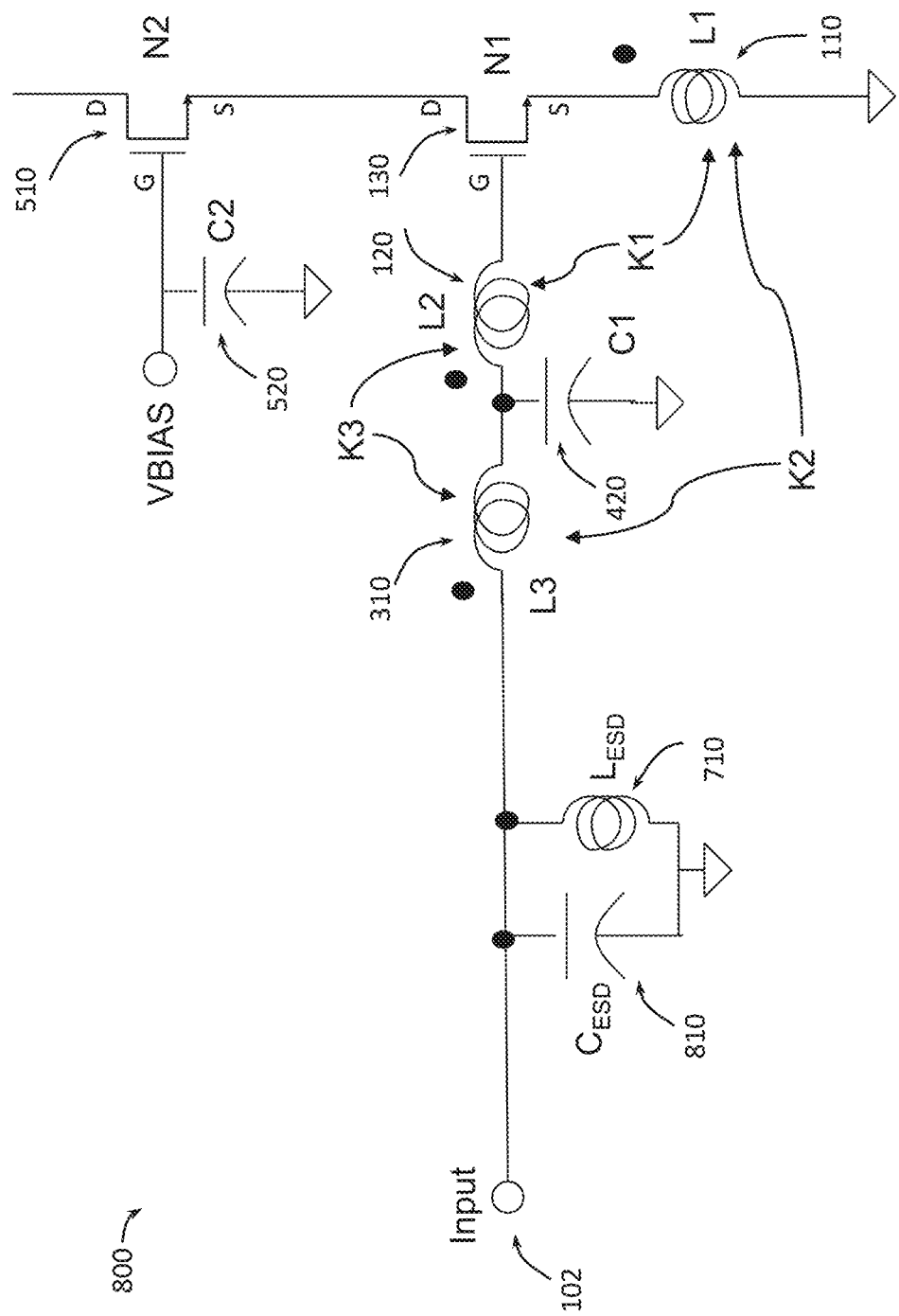
FIG. 8 illustrates an improved source degenerated low noise amplifier, according to some embodiments of the disclosure.

FIG. 8 illustrates an improved source degenerated LNA 800, according to some embodiments of the disclosure. The LNA 800 of FIG. 8 shares many elements with the LNA 700 of FIG. 7; for brevity, a discussion of these elements is not repeated, and these elements may take the form of any of the embodiments disclosed herein.

As shown in FIG. 8, the LNA 800 further includes a shunt capacitor 810 $C_{ESD}$ compared to the LNA 700 of FIG. 7. The shunt capacitor 810 $C_{ESD}$ is coupled between the input node 102 and a ground potential. The shunt capacitor 810 $C_{ESD}$ is further connected in parallel with the inductor 810 $L_{ESD}$ (which is coupled between the input node 102 and a ground potential). The capacitor 810 $C_{ESD}$ is added at the LNA 800's input node 102 to resonant with the inductor 710 $L_{ESD}$ at the operating frequency. The capacitor 810 $C_{ESD}$ can further reduce the impact of the inductor 710 $L_{ESD}$ to the LNA 800 because the shunt resonance of the inductor 710 $L_{ESD}$ and the capacitor 810 $C_{ESD}$ can impose a high impedance at the input of the LNA 800.

Figure 9:
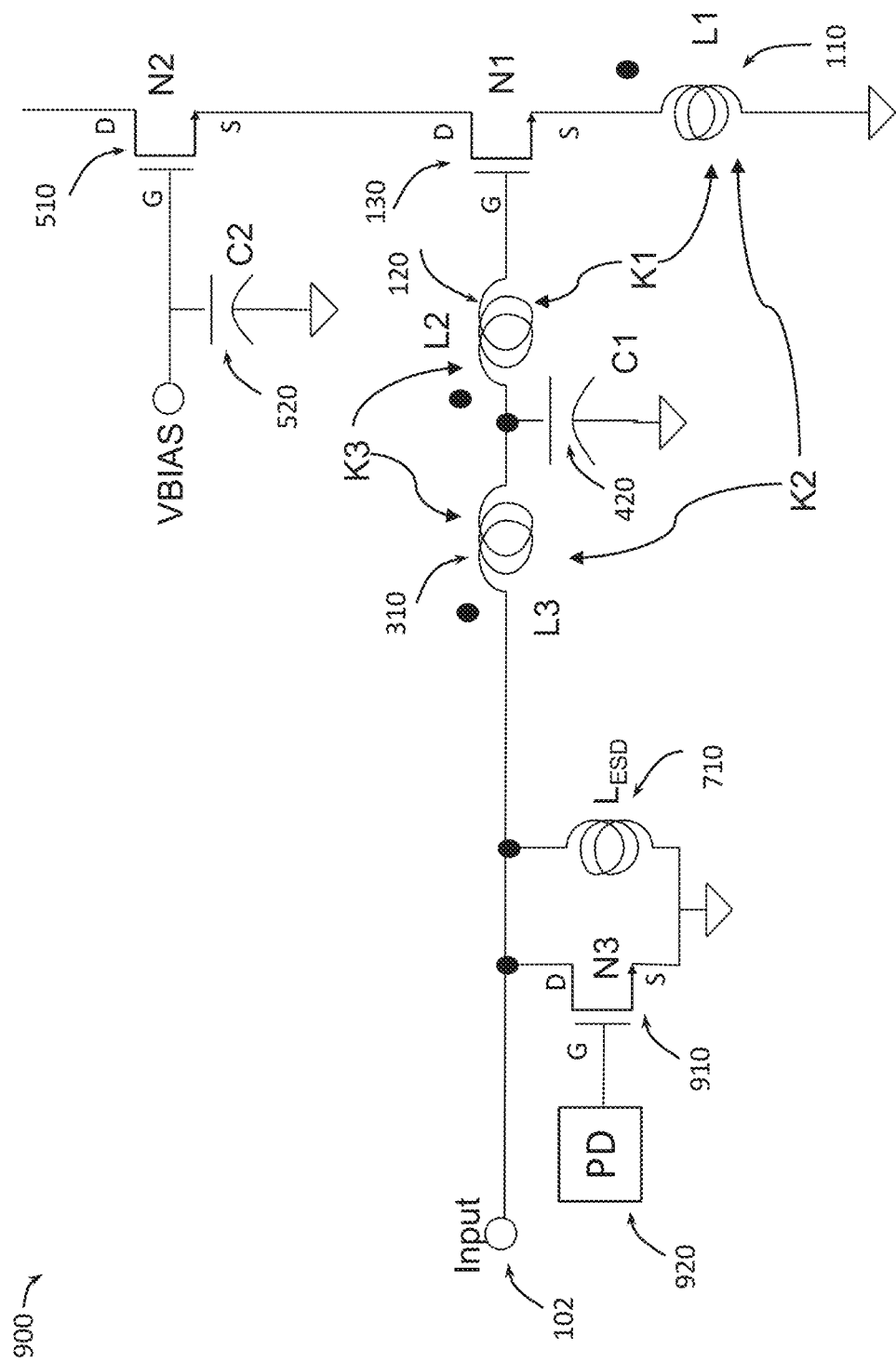
FIG. 9 illustrates an improved source degenerated low noise amplifier, according to some embodiments of the disclosure.

FIG. 9 illustrates an improved source degenerated LNA 900, according to some embodiments of the disclosure. The LNA 900 of FIG. 9 shares many elements with the LNA 700 of FIG. 7; for brevity, a discussion of these elements is not repeated, and these elements may take the form of any of the embodiments disclosed herein.

As shown in FIG. 9, the LNA 900 further includes a power limiter 910 N3 and a power detector (PD) 920 compared to the LNA 700 of FIG. 7. The power limiter 910 N3 is a FET device whose drain (shown by the symbol D) is coupled to the input node 102 and source (shown by the symbol S) is connected to a ground potential. The FET 910 N3 has a gate (shown by the symbol G) which can receive an output from the PD 920 or other suitable control signal. The PD 920 can detect the power of an input signal to the LNA 900. The gate of FET 910 N3 can be supplied with a voltage which can turn on the FET 910 N3 when there is a jam signal at the input or when the input has a large input power. When the FET 910 N3 is turned on (conducting), the input flows through the FET 910 N3 as a shunt path to ground, bypassing the LNA 900 to protect the LNA 900 from large inputs or an ESD event. When the FET 910 N3 is turned off (not conducting), the input is passed to the LNA 900.

Systems which May Use and Benefit from the Improved LNA Circuit Topology

Figure 10:
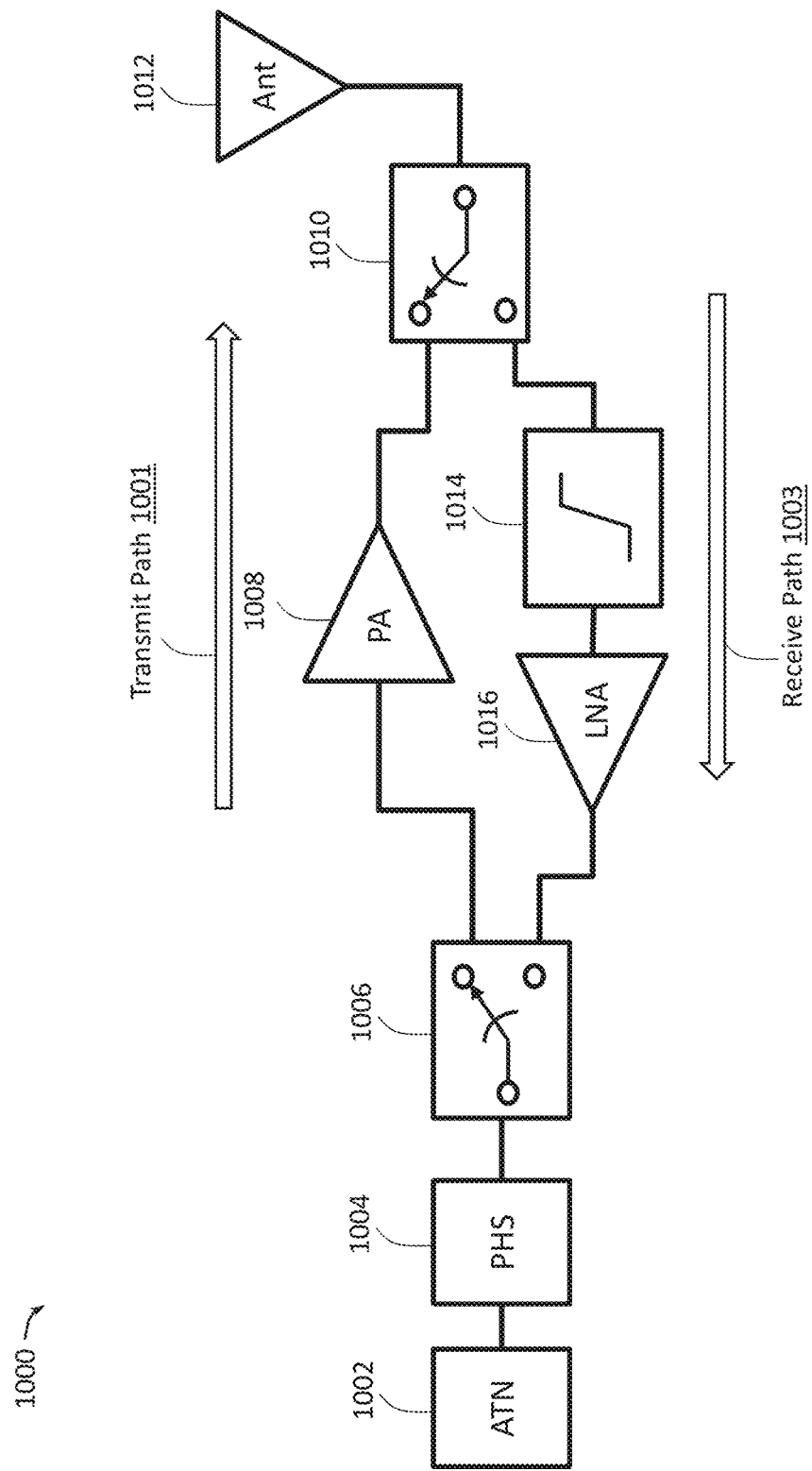
FIG. 10 illustrates an exemplary frontend system in which a low noise amplifier as discussed herein may be implemented, according to some embodiments of the disclosure.

FIG. 10 illustrates an exemplary frontend circuitry 1000 in which an LNA as discussed herein may be implemented, according to some embodiments of the disclosure. As shown, the frontend circuitry 1000 includes an attenuator 1002 (shown as ATN), a phase shifter 1004 (shown as PHS), a switch 1006, a power amplifier 1008 (shown as PA), a transmit/receive (Tx/Rx) switch 1010, an antenna 1012, a signal limiter 1014, and an LNA 1016. In an aspect, the antenna 1012 may be an antenna array including a plurality of individual antenna elements (e.g., arranged in row(s) and/or column(s)). The phase shifter 1004 may adjust the phase of each antenna element in the antenna 1012. The phase adjustments may steer a beam transmitted or received by the antenna 1012, for example, for beamforming to focus the beam in a certain spatial direction. The attenuator 1002 can attenuate or taper the beam transmitted or received by the antenna 1012. The circuitry 1000 may include a transmit path 1001 and a receive path 1003, where the switches 1010 and 1006 may be toggled to provide the transmit path 1001 or the receive path 1003. The power amplifier 1008 may be used for transmitting a signal (e.g., to provide signal amplification in the transmit path 1001), and the LNA 1016 may be used to receive a signal (e.g., to provide signal amplification in the receive path 1003). In some aspects, the signal limiter 1014 placed before the LNA 1016 in the receive path 1003 can protect the LNA 1016, for example, from large stray signals. In some aspects, the elements shown in FIG. 10 can be duplicated for additional antennas or channels. In some aspects, the LNA 1016 can be implemented using any of the improved topologies (e.g., the LNAs 300, 400, 500, 700, 800, and/or 900) described herein to achieve an integrated frontend solution with a low noise figure.

Figure 11:
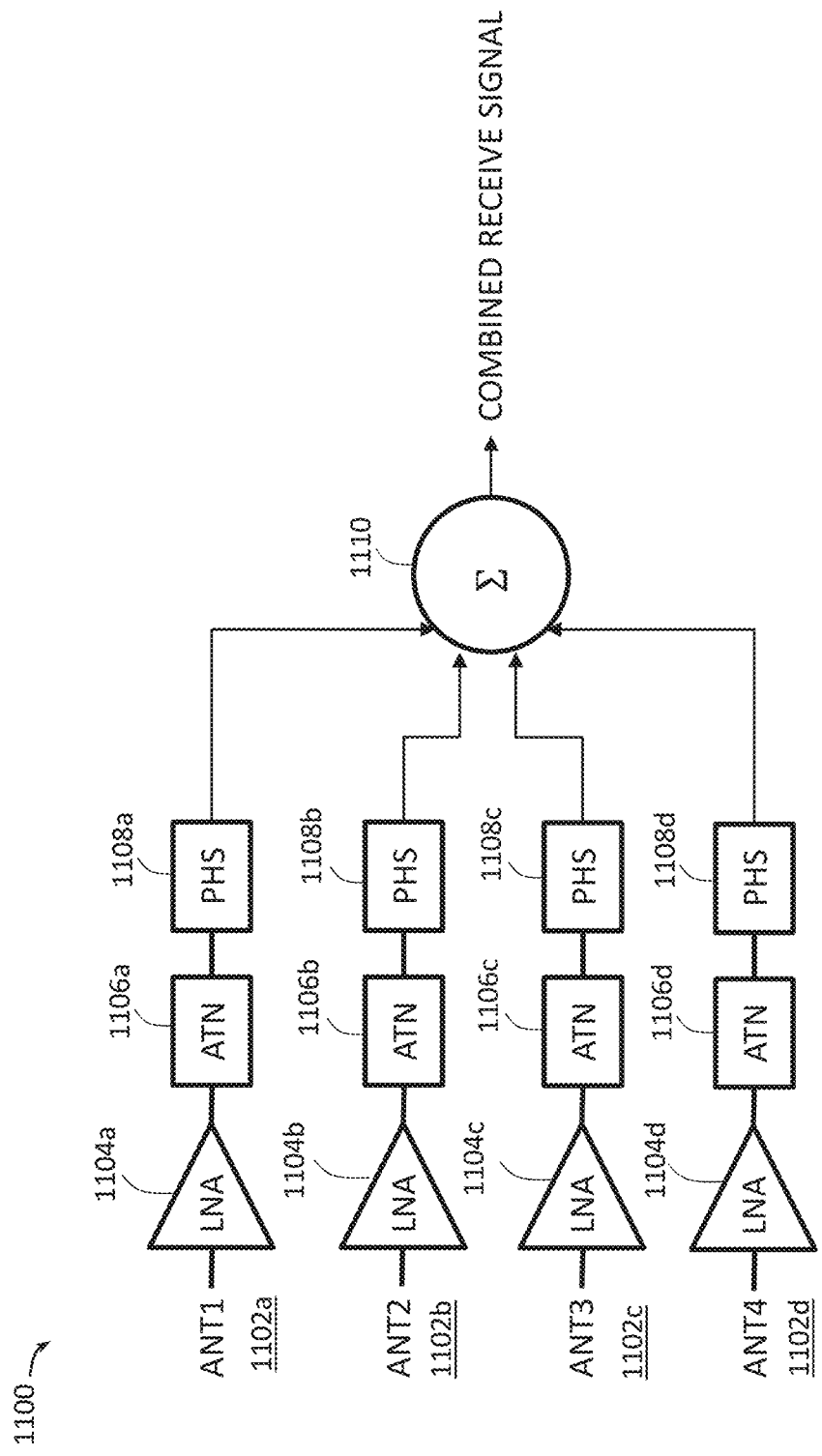
FIG. 11 illustrates an exemplary frontend system in which a low noise amplifier as discussed herein may be implemented, according to some embodiments of the disclosure.

FIG. 11 illustrates an exemplary frontend circuitry 1100 in which an LNA as discussed herein may be implemented, according to some embodiments of the disclosure. In some systems, the receive signals from a plurality of antennas are received by respective frontend circuitry and combined to generate a combined receive signal for further processing. For simplicity, the example shown in FIG. 11 illustrates a frontend that can receive four signals, ANT1 1102a, ANT2 1102b, ANT3 1102c, and ANT4 1102d, from respective antennas. In general, a frontend can be scaled to receive any suitable number of signals (e.g., about 2, 3, 5, 6 or more). For each antenna, an LNA 1104 (e.g., 1104a, 1104b, 1104c, or 1104d), an attenuator 1106 (shown as ATN) (e.g., 1106a, 1106b, 1106c, or 1106d), and a phase shifter 1108 (shown as PHS) (e.g., 1108a, 1108b, 1108c, or 1108d) can be provided to process the received signal. Processed received signals can be summed by a summation network 1110 shown as block Σ to generate a combined receive signal. The LNAs 1104 (shown as 1104a, 1104b, 1104c, and 1104d) can be implemented using any of the improved topologies (e.g., the LNAs 300, 400, 500, 700, 800, and/or 900) described herein to achieve an integrated frontend solution with a low noise figure.

Figure 12:
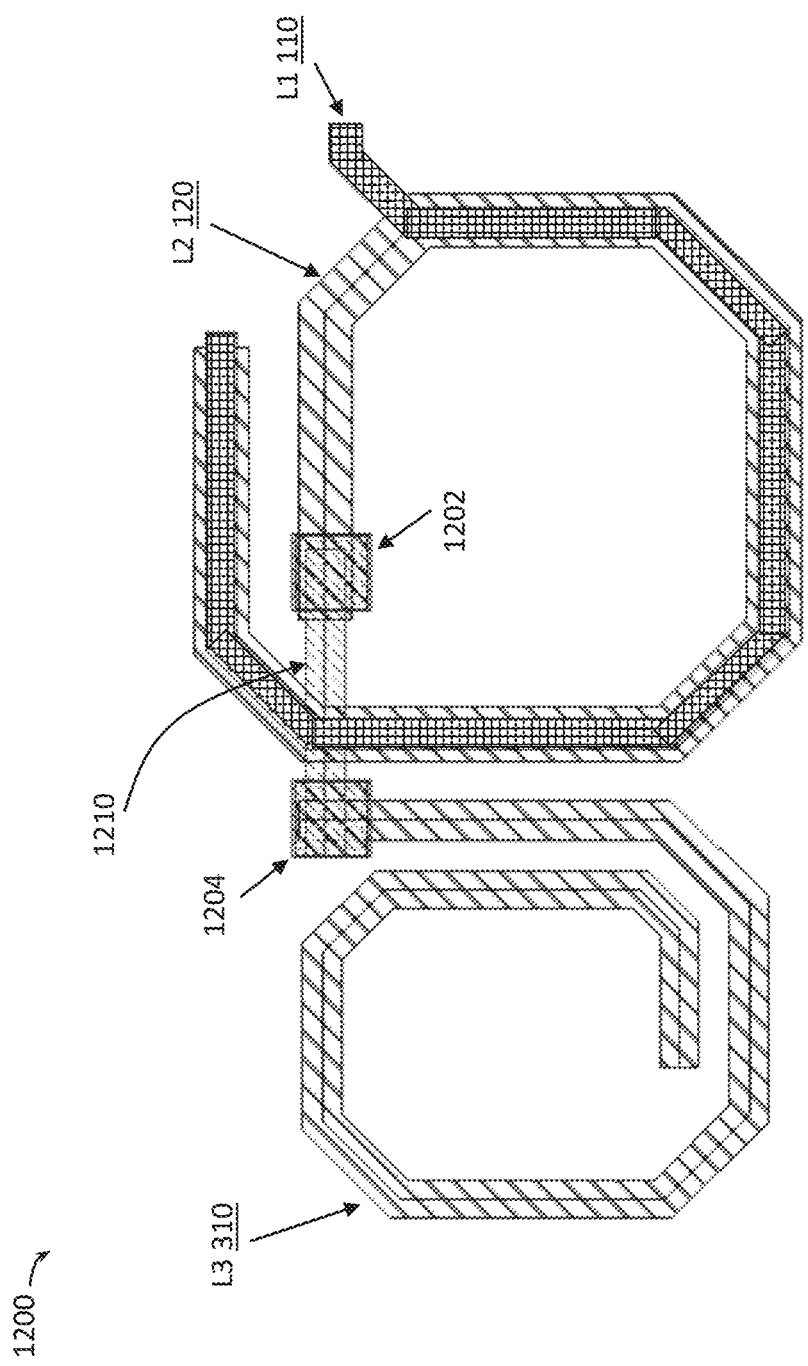
FIG. 12 illustrates an exemplary metal trace arrangement for magnetically coupled inductors in an improved low noise amplifier, according to some embodiments of the disclosure.

FIG. 12 illustrates an exemplary metal trace arrangement 1200 for magnetically coupled inductors in an improved LNA, according to some embodiments of the disclosure. The arrangement 1200 may be used by any of the LNAs 300, 400, 500, 700, 800, 900, 1016, and/or 1106 discussed above. The arrangement 1200 illustrates placements of the magnetically coupled inductors 110, 120, and 310 discussed above, for example, in an integrated device.

In the arrangement 1200, the metal trace of the inductor 110 L1 is placed on a different metal layer than the metal trace of the inductor 120 L2 and the metal trace of the inductor L3 310 and at least partially overlaps with at least one of the metal trace of the inductor 120 L2 or the metal trace of the inductor 310 L3. In some instances, the metal trace of the inductor 110 L1 can be vertically above the metal trace of the inductor 120 L2 and/or the metal trace of the inductor 310 L3. In other instances, the metal trace of the inductor 110 L1 can be vertically below the metal trace of the inductor 120 L2 and/or the metal trace of the inductor 310 L3. More specifically, the metal trace of the inductor 120 L2 and the metal trace of the inductor 310 L3 may be placed on a first metal layer and interconnected by a conductor 1210 placed on a second metal layer, and the metal trace of the inductor 110 L1 may be placed on a third metal layer, where the first, second, and third metal layers are stacked vertically on top of each other.

In the illustrated example of FIG. 12, the metal trace of the inductor 110 L1 is placed vertically above the metal trace of the inductor 120 L2 and may be coupled to the metal trace of the inductor 120 L2 via vertical coupling. Further, the metal trace of the inductor 310 L3 may be coupled to the metal trace of the inductor 110 L1 and the metal trace of the inductor 120 L2 inductor via side coupling.

As further shown, the inductor L3 310 is electrically connected to the inductor L2 120 by a via 1204 coupled between one end of the inductor 310 L3 trace and one end of the conductor 1210 and a via 1202 coupled between one end of the inductor 120 L2 trace and another end of the conductor 1210. That is, the via 1202 and 1204 may be vertical conductors extending between the first metal layer (in which the inductor L2 120 trace and the inductor L3 310 trace are placed) and the second metal layer (in which the conductor 1210 is placed). In some instances, the conductor 1210 may be an overpass, for example, when the second metal layer is vertically above the first metal layer. In other instances, the conductor 1210 may be an underpass, for example, when the second metal layer is vertically below the first metal layer.

In some aspects, the first, second, and/or third metal layer may include other components of an LNA or other circuitries related to frontend operations as discussed above. Further, the device can include additional metal layers.

Figure 13:
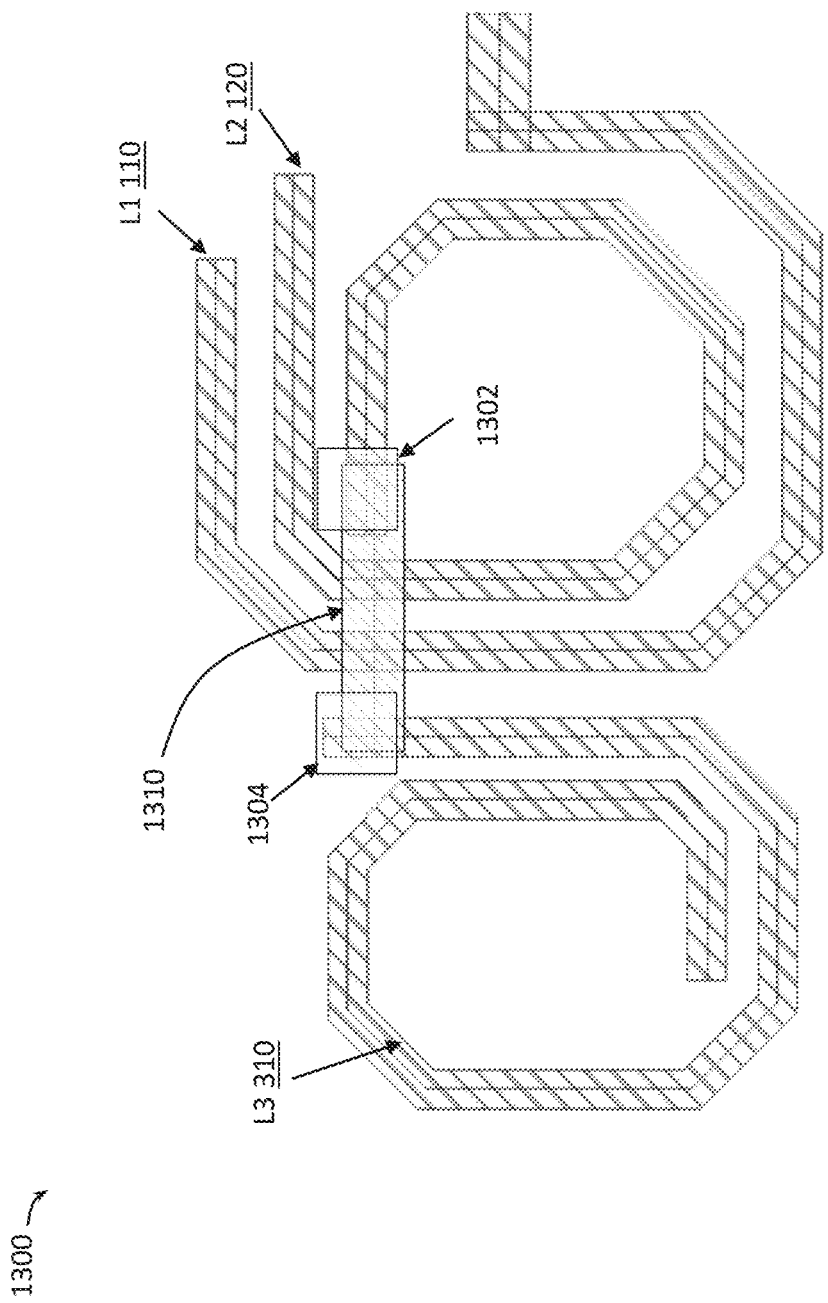
FIG. 13 illustrates another exemplary metal trace arrangement for magnetically coupled inductors in an improved low noise amplifier, according to some embodiments of the disclosure.

FIG. 13 illustrates another exemplary metal trace arrangement 1300 for magnetically coupled inductors, according to some embodiments of the disclosure. The arrangement 1300 may be used by any of the LNAs 300, 400, 500, 700, 800, 900, 1016, and/or 1106 discussed above. The arrangement 1300 illustrates placements of the magnetically coupled inductors 110, 120, and 310 discussed above, for example, in an integrated device.

In the arrangement 1300, the metal trace of the inductor 110 L1 is placed between the metal trace of the inductor 120 L2 and the metal trace of the inductor 310 L3 and on a same first metal layer as the metal trace of the inductor 120 L2 and the metal trace of the inductor 310 L3. Further, the metal trace of the inductor 120 L1 and the metal trace of the inductor 310 L3 are connected by a conductor 1310 on a second metal layer different from the first metal layer. More specifically, the inductor L3 310 is electrically connected to the inductor L2 120 by a via 1304 coupled between one end of the inductor 310 L3 trace and one end of the conductor 1310 and a via 1302 coupled between one end of the inductor 120 L2 trace and another end of the conductor 1310. That is, the via 1302 and 1304 may be vertical conductors extending between the first metal layer (in which the inductor L2 120 trace and the inductor L3 310 trace are placed) and the second metal layer (in which the conductor 1310 is placed). In some instances, the conductor 1310 may be an overpass, for example, when the second metal layer is vertically above the first metal layer. In other instances, the conductor 1310 may be an underpass, for example, when the second metal layer is vertically below the first metal layer.

In some aspects, the first and/or second metal layer may include other components of an LNA or other circuitries related to frontend operations as discussed above. Further, the device can include additional metal layers.

EXAMPLES

Example 1 is a low noise amplifier including a first inductor to receive an input a second inductor coupled to the first inductor in series; a first field effect transistor device whose gate receives a signal from the second inductor; and a third inductor coupled to a source of the field effect transistor device.

In Example 2, the low noise amplifier of Example 1 can optionally include the first inductor and the second inductor being magnetically positively coupled to the third inductor.

In Example 3, the low noise amplifier of Example 1 or 2 can optionally include a metal trace of the third inductor being placed between the first inductor and the second inductor at the same metal layer.

In Example 4, the low noise amplifier of Example 1 or 2 can optionally include a metal trace of the third inductor being placed between vertically above the first inductor and the second inductor in a different metal layer.

In Example 5, the low noise amplifier of Example 1 or 2 can optionally include a metal trace of the third inductor being placed between vertically below the first inductor and the second inductor in a different metal layer.

In Example 6, the low noise amplifier of any one of Examples 1-5 can optionally include a first coupling factor between the first inductor and the third inductor being independently adjustable from a second coupling factor between the second inductor and the third inductor.

In Example 7, the low noise amplifier of any one of Examples 1-6 can optionally include a third coupling factor between the first inductor and the second inductor being smaller than a first coupling factor between the first inductor and the third inductor.

In Example 8, the low noise amplifier of any one of Examples 1-7 can optionally include a third coupling factor between the first inductor and the second inductor being smaller than a second coupling factor between the second inductor and the third inductor.

In Example 9, the low noise amplifier of any one of Examples 1-8 can optionally include a first capacitor coupled between (1) a node between the first inductor and the second inductor, and (2) ground.

In Example 10, the low noise amplifier of any one of Examples 1-9 can optionally include a second capacitor coupled between (1) an input to the low noise amplifier, and (2) ground.

In Example 11, the low noise amplifier of any one of Examples 1-10 can optionally include a second field effect transistor device in cascode configuration with the first field effect transistor device.

In Example 12, the low noise amplifier of Example 11 can optionally include a third capacitor coupled between (1) a gate of the second field effect transistor device.

In Example 13, the low noise amplifier of Examples 11 or 12 can optionally include the first field effect transistor and the second field effect transistor are implemented together as a dual gate field effect transistor device.

In Example 14, the low noise amplifier of any one of Examples 1-13 can optionally include a fourth inductor coupled between (1) an input to the low noise amplifier, and (2) ground.

In Example 15, the low noise amplifier Example 14 can optionally include the fourth inductor having a larger inductance than the first inductor, the second inductor, and the third inductor.

In Example 16, the low noise amplifier of Examples 14 or 15 can optionally include a fourth capacitor coupled between (1) the input to the low noise amplifier, and (2) ground, and in parallel with the fourth inductor.

In Example 17, the low noise amplifier of any one of Examples 14-16 can optionally include a third field effect transistor whose drain is coupled to the input to the low noise amplifier, and source is coupled to ground, and in parallel with the fourth inductor.

In Example 18, the low noise amplifier of Example 17 can optionally include the third field effect transistor whose gate receives a control signal from a power detector.

Example 19 includes a low noise amplifier including a first inductor to receive an input; a second inductor coupled to the first inductor in series; a field effect transistor device whose gate receives a signal from the second inductor; and a third inductor coupled to a source of the field effect transistor device, where a metal trace of the third inductor is adjacent to a metal trace of the first inductor and a metal trace of the second inductor to magnetically couple to the respective first inductor and the respective second inductor.

In Example 20, the low noise amplifier of Example 19 can optionally include where the metal trace of the first inductor, the metal trace of the second inductor, and the metal trace of the third inductor are magnetically coupled to one another via side coupling.

In Example 21, the low noise amplifier of any one of Examples 19-20 can optionally include where the metal trace of the third inductor is placed between the metal trace of the first inductor and the metal trace of the second inductor and on a same first metal layer as the metal trace of the first inductor and the metal trace of the second inductor.

In Example 22, the low noise amplifier of any one of Examples 19-21 can optionally include where the metal trace of the first inductor and the metal trace of the second inductor are connected by a conductor on a second metal layer different from the first metal layer.

In Example 23, the low noise amplifier of Example 19 can optionally include where the metal trace of the third inductor is coupled to the metal trace of the second inductor via vertical coupling; and the metal trace of the first inductor is coupled to the metal trace of the second inductor and the metal trace of the third inductor via side coupling.

In Example 24, the low noise amplifier of any one of Examples 19 or 23 can optionally include the metal trace of the third inductor is placed on a different metal layer than the metal trace of the first inductor and the metal trace of the second inductor and at least partially overlaps with at least one of the metal trace of the first inductor and the metal trace of the second inductor.

In Example 25, the low noise amplifier of any one of Examples 19 or 23-24 can optionally include where the metal trace of the first inductor and the metal trace of the second inductor are placed on a first metal layer and connected by a conductor on a second metal layer; the metal trace of the third inductor is placed on a third metal layer; and the first, second, and third metal layers are vertically on top of each other.

Example 26 includes a frontend circuitry including an antenna; and a low noise amplifier coupled to the antenna. The low noise amplifier includes a first inductor to receive an input from the antenna; a second inductor coupled to the first inductor in series; a field effect transistor device whose gate receives a signal from the second inductor; and a third inductor coupled to a source of the field effect transistor device, wherein the third inductor is magnetically coupled to the first inductor and the second inductor.

In Example 27, the frontend circuitry of Example 26 can optionally include where first coupling factor between the first inductor and the second inductor, a second coupling factor between the first inductor and the third inductor, and a third coupling factor between the second inductor and the third inductor are each greater than 0.1.

Other Implementation Notes, Variations, and Applications

It is also imperative to note that various devices described herein have only been offered for purposes of example and teaching only. Such information may be varied considerably without departing from the spirit of the present disclosure, or the scope of the appended examples. The various embodiments apply only to one non-limiting example and, accordingly, they should be construed as such. In the foregoing description, example embodiments have been described with reference to particular device arrangements. Various modifications and changes may be made to such embodiments without departing from the scope of the appended examples. The description and drawings are, accordingly, to be regarded in an illustrative rather than in a restrictive sense.

Note that with the numerous examples provided herein, interaction may be described in terms of two, three, four, or more electrical devices or components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions herein, such as the functions of circuits shown in FIGURES, illustrate only some of the possible functions that may be carried out by, implemented by, executed by, or within, the systems described herein. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the disclosure encompass all such changes, substitutions, variations, alterations, and modifications as falling within the scope of the appended examples. Note that all optional features of the apparatus described above may also be implemented with respect to the method or process described herein and specifics in the examples may be used anywhere in one or more embodiments.

The invention claimed is:

1. A low noise amplifier, comprising:
a first inductor to receive an input;
a second inductor coupled to the first inductor in series;
a first field effect transistor device having a gate coupled to the second inductor, with the gate configured to receive a signal from the second inductor; and
a third inductor coupled to a source of the first field effect transistor device, wherein the third inductor is magnetically positively coupled to the first inductor by a first coupling factor, and wherein the third inductor is further magnetically positively coupled to the second inductor by a second coupling factor,
the first coupling factor and the second coupling factor independently configured to cause the low noise amplifier to simultaneously satisfy, at least partially, a defined impedance matching condition and a defined noise matching condition.

2. The low noise amplifier of claim 1, wherein another coupling factor between the first inductor and the second inductor is less than the first coupling factor between the first inductor and the third inductor.

3. The low noise amplifier of claim 1, wherein another coupling factor between the first inductor and the second inductor is less than the second coupling factor between the second inductor and the third inductor.

4. The low noise amplifier of claim 1, further comprising:
a first capacitor coupled between a ground potential and a node between the first inductor and the second inductor.

5. The low noise amplifier of claim 4, further comprising:
a second capacitor coupled between an input to the low noise amplifier and the ground potential.

6. The low noise amplifier of claim 1, further comprising:
a second field effect transistor device in a cascode configuration with the first field effect transistor device.

7. The low noise amplifier of claim 6, further comprising:
a capacitor coupled to a gate of the second field effect transistor device.

8. The low noise amplifier of claim 6, wherein the first field effect transistor device and the second field effect transistor device are implemented together as a dual gate field effect transistor device.

9. The low noise amplifier of claim 1, further comprising:
a fourth inductor coupled between an input to the low noise amplifier and a ground potential.

10. The low noise amplifier of claim 9, wherein the fourth inductor has an inductance that is larger than a first inductance of the first inductor, a second inductance of the second inductor, and a third inductance of the third inductor.

11. The low noise amplifier of claim 10, further comprising:
a capacitor coupled between the input to the low noise amplifier and a second ground potential, with the capacitor in parallel with the fourth inductor.

12. The low noise amplifier of claim 10, further comprising:
a third field effect transistor device having a drain that is coupled to the input to the low noise amplifier and further having a source that is coupled to a second ground potential, with the third field effect transistor device further connected in parallel with the fourth inductor.

13. The low noise amplifier of claim 12, wherein the third field effect transistor device has a gate that is configured to receive a control signal from a power detector.

14. A frontend circuitry, comprising:
an antenna; and
a low noise amplifier coupled to the antenna, the low noise amplifier comprising:
a first inductor configured to receive an input from the antenna;
a second inductor coupled to the first inductor in series;
a field effect transistor device having a gate configured to receive a signal from the second inductor; and
a third inductor coupled to a source of the field effect transistor device, wherein the third inductor is magnetically positively coupled to the first inductor by a first coupling factor, and wherein the third inductor is further magnetically positively coupled to the second inductor by a second coupling factor,
the first coupling factor and the second coupling factor independently configured to cause the low noise amplifier to simultaneously satisfy, at least partially, a defined impedance matching condition and a defined noise matching condition.

15. The frontend circuitry of claim 14, wherein a first coupling factor between the first inductor and the second inductor, a second coupling factor between the first inductor and the third inductor, and a third coupling factor between the second inductor and the third inductor are each greater than 0.1.

* * * * *